United States Patent [19]
Kiriaki et al.

[11] Patent Number: 6,035,320
[45] Date of Patent: Mar. 7, 2000

[54] FIR FILTER ARCHITECTURE

[75] Inventors: Sami Kiriaki; William R. Krenik, both of Garland, Tex.

[73] Assignee: Texas Instruments Incorporated, Dallas, Tex.

[21] Appl. No.: 08/368,679

[22] Filed: Jan. 4, 1995

[51] Int. Cl.[7] .............................. G06G 7/02; G06F 17/10
[52] U.S. Cl. ........................ 708/819; 708/316; 708/319
[58] Field of Search ................................. 364/825, 602, 364/724.16, 724.13

[56] References Cited

U.S. PATENT DOCUMENTS

| | | | |
|---|---|---|---|
| 4,120,035 | 10/1978 | Cases et al. | 364/602 |
| 4,475,170 | 10/1984 | Hague | 364/825 |
| 4,703,447 | 10/1987 | Lake, Jr. | 364/825 |
| 5,050,119 | 9/1991 | Lish | 364/724.13 |
| 5,185,714 | 2/1993 | Nakayama | 364/736 |
| 5,311,457 | 5/1994 | Shizawa | 364/724.13 |
| 5,381,354 | 1/1995 | Soloff | 364/724.13 |

OTHER PUBLICATIONS

Alan V. Oppenheim, et al., "Digital Signal Processing", pp. 155–163.

Gregory T. Uehara and Paul R. Gray, A 100MHz Output Rate Analog–to–Digital Interface for PRML Magnetic–Disk Read Channels in 1.2um CMOS, ISSCC94/Session 17/Disk–Drive Electronics/ Paper FA 17.3, *1994 IEEE International Solid–State Circuits Conference*, pp. 280–281.

Richard G. Yamasaki, et al., "72Mb/S PRML Disk–Drive Channel Chip with an Analog Sampled Data Signal Processor", ISSCC94/Session 17/Disk–Drive Electronics/Paper FA 17.2, *1994 IEEE International Solid–State Circuits Conference*, pp. 278, 279.

Ramon Gomez, et al., "A Discrete–Time Analog Signal Processor for Disk Read Channels", ISSCC 93/Session 13/Hard Disk and Tape Drives/Paper FA 13.1, *1993 ISSCC Slide Supplement*, pp. 162, 163, 279, 280.

Gregory T. Uehara, et al. A 50MHz 70 mW 8–Tap Adaptive Equalizer/Viterbi Sequence Detector in 1.2 um CMOS, *1994 IEEE Custom Integrated Circuits Conference*, pp. 51–54.

*Primary Examiner*—Tan V. Mai
*Attorney, Agent, or Firm*—Mark A. Valetti; Carlton H. Hoel; Richard L. Donaldson

[57] ABSTRACT

A novel Finite Impulse Response filter (FIR) Filter is provided which includes a plurality of multipliers (14–22), a plurality of multiplexers (24–32), and a plurality of sample and hold circuits (34–42). At least two of the sample and hold circuit output signals (1–5) may be multiplexed in a round robin fashion to at least two of the multipliers (14–22). The multipliers may receive as a second input, fixed tap coefficient signals ($C_1$–$C_5$) for multiplication with the multiplexed sample and hold circuit output signals (1–5).

20 Claims, 2 Drawing Sheets

FIR FILTER ARCHITECTURE

CROSS-REFERENCE TO RELATED APPLICATIONS

This application is related to copending U.S. application Serial No. 08/368,680, Attorney's Docket No. TI-19521, filed on Jan. 4, 1995 by Sami Kiriaki, et al. and entitled "FIR Filter Architecture With Precise Timing Acquisition".

TECHNICAL FIELD OF THE INVENTION

This invention relates generally to signal processing and more particularly, to an improved FIR filter architecture.

BACKGROUND OF THE INVENTION

Digital filters are being used in an increasing number of electronic devices. One commonly used type of digital filter is a finite impulse response (FIR) filter.

The finite impulse response filter is a sampled data filter characterized by its impulse response. The input signal is a discrete time sequence which may be analog or digital while the output is also a discrete time sequence which is the convolution of the input sequence and the filter impulse response. The relationship between the input samples $V_i[n]$ and output samples $V_O[n]$ is given by:

$$V_O[n]=A_0V_i[n]+A_1V_i[n-1]+A_2V_i[n-2]+ \ldots +A_{N-1}V_i[n-N+1] \quad (1)$$

Applying the Z-transform, the previous relationship can be represented as:

$$V_0(Z)=A_0V_i+A_1V_iZ^{-1}+A_2V_iZ^{-2}+ \ldots +A_{N-1}V_iZ^{-(N-1)} \quad (2)$$

The components of the coefficient vector $A_0 \ldots A_{N-1}$ are ordinarily referred to as filter tap weights. In the impulse response of the filter, there is no feedback and thus it is an all zero filter, which means that the response is shaped by placement of transmission zeroes in the frequency domain. This class of filters facilitates the implementation of adaptive filter structures.

FIR filters may be implemented in the analog domain or in the digital domain. An analog FIR filter implementation typically performs multiplication of the tap weights and the input signal samples using analog multipliers, and sums each term using an analog summer. In a digital FIR filter implementation, multiplication of the tap weights and the input signal samples, as well as summation of each term in equation 1, are typically performed digitally.

Although digital FIR filters normally produce an output signal with a higher signal to noise ratio than an analog FIR filter, digital FIR filters are impractical for some applications. For example, analog FIR filters may normally operate at much higher speeds than digital FIR filters. Analog FIR filters, therefore, are most commonly used in high speed applications such as, for example, magnetic disk drive read channels, radios, modems, and communication channels. However, existing architectures for FIR filters have various drawbacks when used for analog FIR filters.

One existing analog FIR implementation is an analog delay line based architecture. This architecture typically includes an analog delay line, analog multipliers, and an N-input analog summing block. The filter output is the sum of the inner product of the input vector and the coefficient vector. The analog delay line is normally composed of a chain of analog sample and hold amplifiers. Each sample and hold amplifier samples during the holding time of the preceding sample and hold amplifier in the chain. The problem with the delay line based architecture is that in the process of sampling, the signal acquires a certain amount of noise, offset, and distortion. After the analog signal has passed through a chain of sample and hold amplifiers, the level of distortion is often unacceptable.

An analog FIR filter architecture that avoids multiple sampling of the input signal is one employing round robin sampling of the input signal. In this type of architecture, the signal is sampled in a round robin manner, preventing error accumulation from one sample and hold amplifier to the next. Each sample and hold amplifier's output connects to an analog multiplier. In order to simulate delay, the output of the sample and hold amplifier is multiplied in the analog multiplier by a series of tap weights that are shuffled every clock cycle. For example, in a three tap filter, the output of a given sample and hold amplifier will be multiplied by tap weight $A_0$ during the first clock cycle after sampling, by tap weight $A_1$ during the second clock cycle after sampling, and by tap weight $A_3$ on the third clock cycle after sampling.

The problem with this architecture is that the digital tap weights need to be shuffled every clock cycle. A large number of signals, therefore, need to be switched on every clock cycle. For example, in a 9 tap filter using 6-bit digital-to-analog converters, 54 signals are switched during every clock cycle. This heavy switching consumes a large amount of power, especially if the signals are at full CMOS levels. In addition, switching noise can be significant and can affect filter performance. For certain digital-to-analog converter (DAC) circuit implementations where overlapping clocks are required, both true and complement signals are needed. This will double the number of shuffled signals, increasing both power consumption and digital noise generation. Moreover, the shuffling of coefficients every clock cycle poses great demand on the settling time of the DACs. Lesser setting time is attained at the expense of larger power consumption as faster DAC's consume more power.

The previous two analog FIR filter structures described above are known as direct form FIR filter implementations. An alternative filter implementation is called a transpose-form FIR filter architecture. In a transpose-form FIR filter, the input signal is multiplied by all of the tap coefficients, and delayed versions of the taps are combined together at the output to form the final filter output. Integrators integrate the final filter output over N-clock cycles for an N-tap filter. During each clock cycle, a new multiplying DAC is switched and accumulated in a round robin manner on the integrating capacitor of the integrator block. This FIR filter architecture thus eliminates tap coefficient shuffling at the input of each multiplying DAC.

The problem with this architecture, however, is in the circuit implementation of the integrators and multiplying DACs. In order to achieve high speed and low power consumption, a current-based multiplying DAC is normally used. Then, to perform summation, the current produced by the multiplying DACs in switched onto the capacitor which sums up the charge over N clock cycles. Although such circuit implementation may achieve greater speed, filter performance is greatly diminished due to both clock jitter and integration of switching transients.

SUMMARY OF THE INVENTION

Accordingly, a need has arisen for a high speed FIR filter architecture that consumes less power than existing architectures, eases circuit implementation of FIR filters, and improves filter performance both in terms of dynamic range and linearity. The present invention achieves these advantages while avoiding the problems of the prior art. One aspect of the invention is an FIR filter architecture comprising a plurality of multipliers, a plurality of multiplexers, and a plurality of sample and hold circuits. A plurality of the sample and hold circuits' output signals may be multiplexed in a round robin manner to at least two of the multipliers. The multipliers may receive as a second input, tap coefficient signals for multiplication with the multiplexed sample and hold circuit output signals.

The present invention has a number of important technical advantages. First, unlike existing round robin sampling architectures, the present invention avoids the need for coefficient shuffling. Instead, sample and hold circuit outputs may be multiplexed, reducing the number of signals that must be switched during each clock cycle. Also, NMOS switches may be used to implement the present invention because there is no need to use CMOS switches to handle full CMOS digital output levels. Another important technical advantage of the present invention is that DAC complexity can be reduced because each multiplying DAC has a dedicated tap coefficient. Each DAC can be trimmed separately to accommodate a certain coefficient range.

Because coefficient shuffling is not performed on every clock cycle, the settling speed requirement for the DACs is reduced. This reduction results in lower power consumption. Because the coefficient multipliers are the same for every filter output, pattern dependent errors can be reduced. The architecture of the present invention implements a direct form FIR filter instead of a transpose form FIR filter, thus avoiding the need for output integrators. As a result, the present invention achieves improved filter performance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
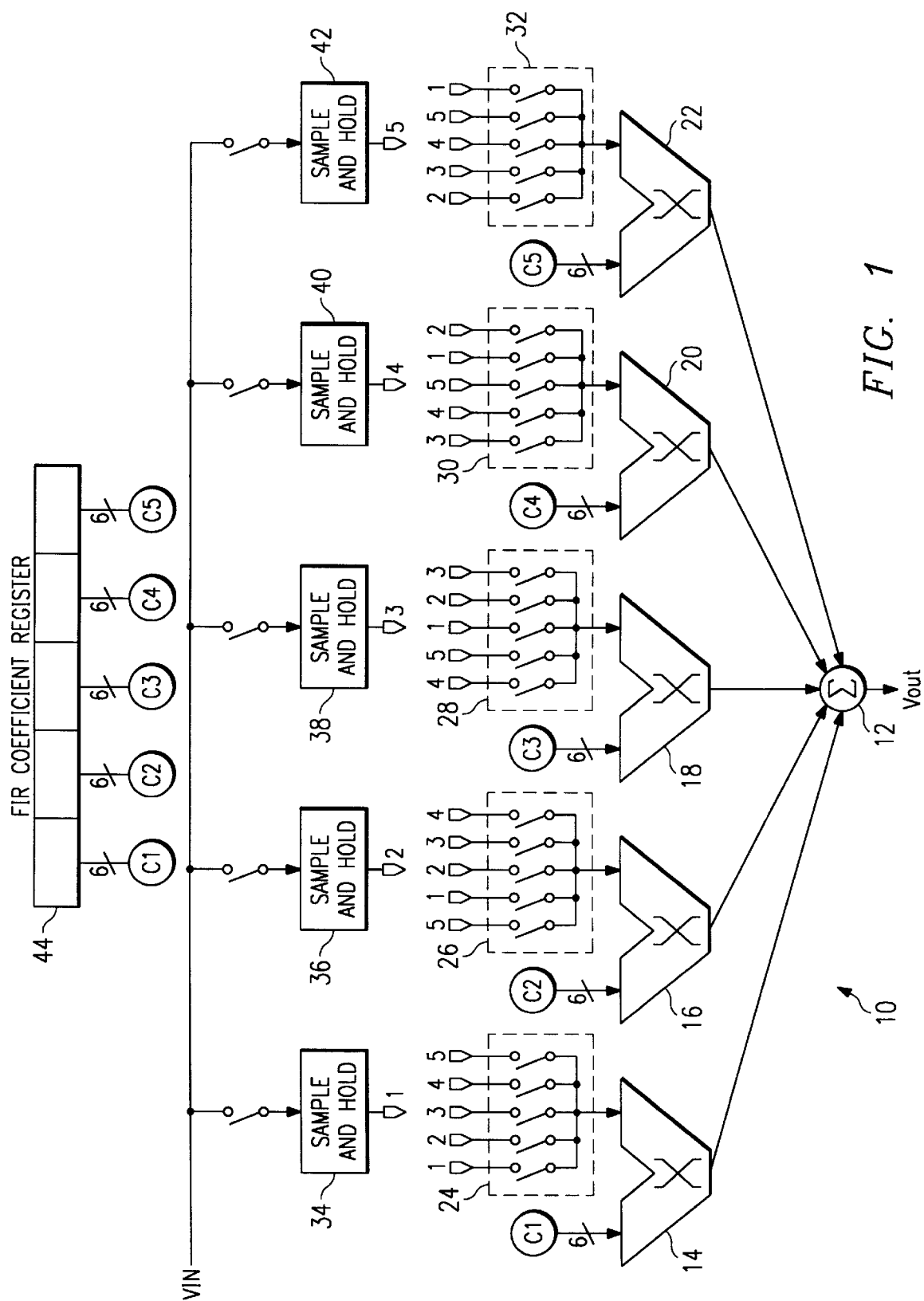
FIG. 1 illustrates one embodiment of an FIR filter constructed in accordance with the teachings of the present invention.
Figure 2:
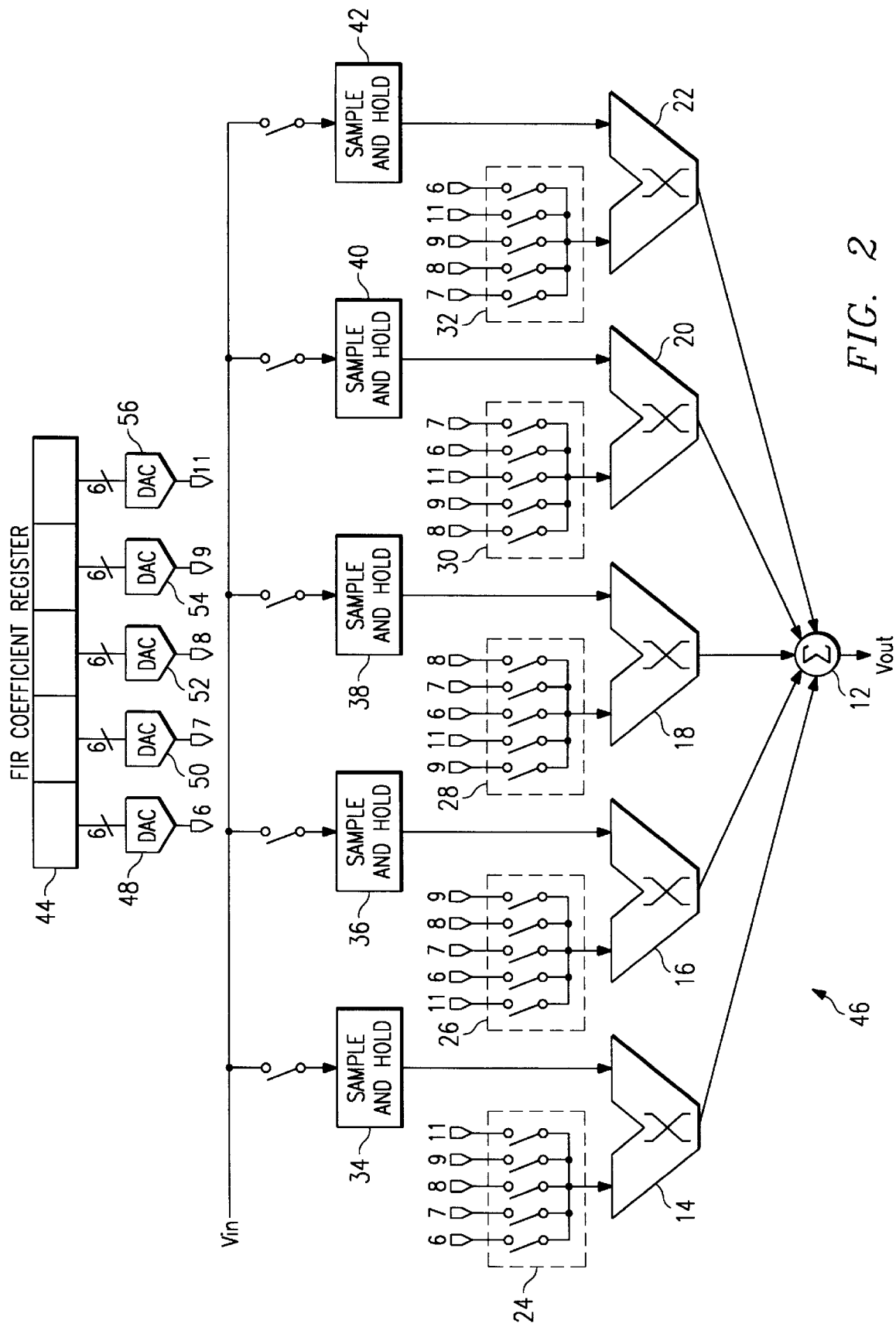
FIG. 2 illustrates a second embodiment of an FIR filter constructed in accordance with the teachings of the present invention.

The present invention and its advantages are best understood by referring to FIGS. 1–2 of the drawings, like numerals being used for like and corresponding parts of the various drawings.

FIG. 1 illustrates one embodiment of an FIR filter 10 constructed in accordance with the teachings of the present invention. FIR filter 10 may comprise summer 12, multipliers 14–22, multiplexers 24–32, sample and hold circuits 34–42 and coefficient register 44. The present invention is preferably used for an analog filter implementation, but may also be used in a digital FIR filter implementation. Below, the invention will be described in accordance with an analog implementation using primarily analog components. Equivalent digital components may be substituted for the analog components.

FIR filter 10 as illustrated in the embodiment of FIG. 1, is a five tap filter. Although a preferred embodiment is described in the context of a five tap filter, FIR filter 10 may have any number of taps. Similarly, although the number of multiplexers 24–32 and sample and hold circuits 34–42 equals the number of taps in FIR filter 10, more or less multiplexers 24–32 and/or sample and hold circuits 34–42 could be used in a five tap filter employing the architecture of the present invention.

The present invention achieves its advantages by supplying a plurality of fixed tap coefficient signals $C_1$–$C_5$ to a plurality of multipliers 14–22 with one fixed tap coefficient signal per multiplier. The outputs of a plurality of sample and hold circuit output signals 1–5 are then multiplexed in a round robin manner to multipliers 14–22. In other embodiments, the sample and hold output signals may be multiplexed to less than all of multipliers 14–22.

Summer 12 may be, for example, an analog summer that receives five analog inputs and produces an analog output. Alternatively, summer 12 could be an analog summer that receives analog inputs and includes a DAC to produce a digital output. Similarly, summer 12 could produce a digital output from a plurality of digital inputs or produce an analog output from a plurality of digital inputs. The output of summer 12, $V_{OUT}$, may represent the output signal produced by FIR filter 10. In this embodiment, each input to summer 12 connects to an output of one of multipliers 14–22. Another sample and hold circuit could be coupled to the output of summer 12 to provide stability to the output of FIR filter 10.

In this embodiment, multipliers 14–22 are multiplying DACs. Multipliers 14–22 receive one digital input and one analog input convert the digital input to an analog value, and produce an analog product of the two inputs. Multipliers 14–22 could also be, for example, any other type of multiplier with any combination of analog or digital inputs and an analog or digital output.

One input of multipliers 14–22 receives a coefficient signal $C_1$–$C_5$. For example, multiplier 14 has an input to receive coefficient $C_1$. In this embodiment, coefficient $C_1$ is a 6-bit digital value. Coefficient signal $C_1$, however, could have any number of bits or be an analog signal. Coefficient $C_1$ also could have a different number of bits than coefficient signals $C_2$–$C_5$. Similarly, certain ones of coefficient signals $C_1$–$C_5$ could be digital signals while others could be analog signals.

Coefficient signals $C_1$–$C_5$ are supplied by coefficient register 44 in this embodiment. Coefficient register 44 may be a programmable register that may receive data values for coefficients $C_1$–$C_5$ from an outside source (not explicitly shown). By using a programmable coefficient register 44, a programmable multi-tap FIR filter integrated circuit may be created. FIR coefficient register 44 produces 6-bit digital outputs for coefficient signals $C_1$–$C_5$ in this embodiment.

Another alternative to coefficient register 44 is a plurality of coefficient circuits (not explicitly shown). Each coefficient circuit can be operable to produce a coefficient signal ($C_1$–$C_5$) at an output to the coefficient circuits, with each coefficient signal representing an FIR coefficient. The outputs of such coefficient circuits can then be coupled to an input of multipliers 14–22. Such coefficient circuits can be either hard wired or programmable.

Sample and hold circuits 34–42 each receive an input signal, $V_{IN}$. $V_{IN}$ may be, for example, the input signal filtered by FIR filter 10. Timing for sample and hold circuits 34–42 may be controlled by one or more external clock signals (not explicitly shown). The output of each sample and hold circuit 34–42 may be coupled to one or more multiplexers 24–32.

In FIG. 1, each sample and hold circuit 34–42 is coupled to one input of each multiplexer 24–32 as illustrated.

Alternatively, the outputs of sample and hold circuits 34–42 may be connected to less than each of the multiplexers 24–32. Sample and hold circuits 34–42 in this embodiment have analog inputs and analog outputs. Equivalently, sample and hold circuits 34–42 may have any combination of analog or digital inputs and analog or digital outputs.

Multiplexers 24–32 comprise a plurality of inputs and an output. Multiplexers 24–32 may be controlled by external control signals (not explicitly shown). The output of each multiplexer 24–32 in this embodiment connects to an input of one of the multipliers 14–22. Here, multiplexers 24–32 have analog inputs and analog outputs, but any combination of analog or digital inputs and analog or digital outputs could be used with the present invention.

Given the above architecture, the operation of FIR filter 10 is as follows. In operation, the input signal $V_{IN}$ may be sampled and held at each sample and hold circuit 34–42 in a round robin manner. An example of operations over several consecutive clock cycles will illustrate such round robin sampling. During the first clock cycle, sample and hold circuit 34 samples input signal $V_{IN}$ while the remaining sample and hold circuits 36–42 continue to hold the last previously sampled value. In the second clock cycle, sample and hold circuit 36 samples input signal $V_{IN}$ while sample and hold circuits 34, & 38–42 continue to hold the last previously sampled value. This process continues until the fifth clock cycle when sample and hold circuit 42 samples input signal $V_{IN}$ while sample and hold circuits 34–40 continue to hold the last previously sampled value. This process may then be repeated. In this embodiment, then, each sample and hold circuit 34–42 holds a sampled value of input signal $V_{IN}$ for five clock cycles.

Also, in this embodiment, the sample and hold output circuit output signals 1–5 are multiplexed in a round robin manner to multipliers 14–22. An example of several consecutive clock cycles will illustrate such round robin multiplexing. During the first clock cycle, sample and hold output 1 is multiplexed to multiplier 14. During the second clock cycle, sample and hold output 1 is multiplexed to multiplier 16. This process continues and at the fifth clock cycle, sample and hold output 1 is multiplexed to multiplier 22. At the sixth clock cycle, sample and hold circuit 34 once again samples input signal $V_{IN}$ and sample and hold output 1 may be multiplexed to multiplier 14. The operation for the remaining sample and hold outputs 2–5 is similar to that of sample and hold output 1.

The present invention achieves advantages by using a fixed coefficient for each multiplier 14–18. The use of a fixed coefficient avoids the need to multiplex a large number of coefficient signals during each cycle. FIR filter 10 thus fixes the coefficients and multiplexes sampled values of the input signal in a round robin fashion. The input signal is also sampled in a round robin fashion to avoid the problems of delay lines.

FIG. 2 illustrates a second embodiment of an FIR filter 46 constructed in accordance with the teachings of the present invention. Although FIR filter 46 samples input signal $V_{IN}$ in a round robin fashion, this embodiment multiplexes analog versions of the FIR coefficients in a round robin manner, while coupling the outputs of sample and hold circuits 34–42 to the input of multipliers 14–22. A difference between this embodiment and the embodiment shown in FIG. 1 is that FIR filter 46 (FIG. 2) has a sample and hold circuit assigned to a multiplier while FIR filter 10 (FIG. 1) has an FIR coefficient signal assigned to a multiplier.

FIR filter 46 may include DACs 48–56. DACs 48–56 each receive an output from FIR coefficient register 44. FIR coefficient register 44 produces, 6-bit digital values but could also produce digital values with any number of bits. DACs 48–56 convert digital inputs into analog outputs 6–9, & 11. DAC outputs 6–9 and 11, each connect to an input of multiplexers 24–32.

Because multipliers 14–22 receive an analog output from sample and hold circuits 34–42 and an analog output from multiplexers 24–32, multipliers 14–22 may be ordinary analog multipliers rather than multiplying DACs.

In operation, sample and hold circuits 34–42 sample input signal $V_{IN}$ in a round robin manner as described above. Analog versions of each FIR coefficient are then multiplexed in a round robin manner to each multiplier using multiplexers 24–32. The present invention thus avoids the deficiencies of existing architectures because each coefficient need not be converted from a digital value to an analog value during each clock cycle. Rather, the conversion can be performed once. FIR filter 46, therefore, allows the use of slower and more power efficient DACs 48–56 and achieves greater power savings by avoiding the need to perform a digital-to-analog conversion during each clock cycle for each tap coefficient.

Although the present invention and its advantages have been described in detail, it should be understood that various changes, substitutions and alterations can be made therein without departing from the spirit and scope of the invention as defined by the appended claims.

What is claimed is:

1. An FIR filter having an input signal and a filtered output, comprising:
    a plurality of multipliers, each said multiplier including a first multiplier input, a second multiplier input and an output, each said first multiplier input receiving a signal representing an FIR coefficient;
    a plurality of sample and hold circuits, each of said plurality of sample and hold circuits including a first output and operable to sample said input signal and hold the value of said input signal on said first output for a predetermined time;
    a plurality of multiplexers, each comprising a plurality of multiplexer inputs and a second output, at least two of said second outputs each coupled to one of said second multiplier inputs, and at least one of said plurality of multiplexer inputs of a first predetermined number of multiplexers coupled to said first output of a first of said sample and hold circuits; and
    a summer connected to said output of each of said multipliers, said summer having an output which is said filtered output of said FIR filter.

2. The FIR filter of claim 1, further comprising:
    a coefficient register comprising a plurality of coefficient outputs and operable to store a plurality of data values representing FIR coefficients, said coefficient register further operable to produce a coefficient signal on at least two of said plurality of coefficient outputs representing an FIR coefficient, wherein at least one of said coefficient outputs is coupled to one of said first multiplier inputs.

3. The FIR filter of claim 2, wherein said coefficient register is further operable to receive said plurality of data values as inputs.

4. The FIR filter of claim 1 wherein each said coefficient signal comprises a digital value.

5. The FIR filter of claim 4 wherein each of said plurality of multipliers further comprises conversion circuitry operable to convert a digital value at said first multiplier input into an analog signal.

6. The FIR filter of claim 1 wherein the number of said plurality of multipliers equals the number of said plurality multiplexers.

7. The FIR filter of claim 1 wherein each said second output comprises an analog signal.

8. The FIR filter of claim 1 wherein the number of said plurality of sample and hold circuits equals the number of said plurality of inputs on each of said multiplexers.

9. The FIR filter of claim 1 wherein each said first output comprises an analog signal.

10. The FIR filter of claim 1, further comprising:
a plurality of coefficient circuits each comprising a coefficient output, said coefficient circuits operable to produce a coefficient signal at said coefficient output representing an FIR coefficient, wherein at least one coefficient output is coupled to one of said first multiplier inputs.

11. A method of making an FIR filter which has an input signal and a filtered output, said method comprising the steps of:
supplying a plurality of fixed tap coefficient signals to a plurality of multipliers, one fixed tap coefficient signal per multiplier;
providing said input signal to each of a plurality of sample and hold circuits, each of said sample and hold circuits having an output which provides an output signal;
multiplexing said plurality of sample and hold circuit output signals in a round robin manner to at least two of said multipliers; and
summing the output of each of said plurality of multipliers, said sum being the filtered output of said FIR filter.

12. The method of claim 11, further comprising the step of sampling an input signal with each said sample and hold circuit in a round robin manner.

13. The method of claim 11 wherein said fixed tap coefficient signals are digital signals.

14. The method of claim 11 wherein said sample and hold circuit output signals are analog signals.

15. The method of claim 11 wherein said plurality of fixed tap coefficient signals is supplied by an FIR coefficient register.

16. The method of claim 11 wherein said multiplexing step further comprises the step of multiplexing said output signals in a round robin manner to each said multiplier.

17. A method of making an FIR filter which has an input signal and a filtered output, said method comprising the steps of:
providing said input signal to each of a plurality of sample and hold circuits, each of said sample and hold circuits having an output which provides an output signal;
supplying said plurality of sample and hold circuit output signals to a plurality of multipliers, one output signal per multiplier;
multiplexing a plurality of fixed tap coefficient signals in a round robin manner to each of said plurality of multipliers wherein said fixed tap coefficient signals are analog signals; and
summing the output of each of said plurality of multipliers, said sum being the filtered output of said FIR filter.

18. The method of claim 17 wherein each of said plurality of fixed tap coefficient signals is supplied by a digital to analog converter.

19. The method of claim 18 wherein each said digital to analog converter receives a digital input from an FIR coefficient register.

20. The method of claim 17 wherein said sample and hold circuit output signals are analog signals.

* * * * *